(12) United States Patent
Zhang et al.

(10) Patent No.: US 11,971,452 B2
(45) Date of Patent: Apr. 30, 2024

(54) DEVICE AND METHOD FOR NONDESTRUCTIVELY DETECTING TRANSIENT CHARACTERISTIC OF CONDUCTIVE SCREW OF TURBO-GENERATOR ROTOR

(71) Applicant: HANGZHOU HENUOVA TECHNOLOGY CO., LTD., Hangzhou (CN)

(72) Inventors: Yuewu Zhang, Hangzhou (CN); Jianxi Liu, Hangzhou (CN); Yanxing Bao, Hangzhou (CN); Weihua Zha, Hangzhou (CN); Qianyi Zhang, Hangzhou (CN); Dongbing Liu, Hangzhou (CN); Weixing Yang, Hangzhou (CN); Xu Han, Hangzhou (CN); Miaoye Li, Hangzhou (CN); Zirui Wang, Hangzhou (CN); Junliang Liu, Hangzhou (CN); Jie Luo, Hangzhou (CN); Weitao Shen, Hangzhou (CN); Yu Fu, Hangzhou (CN); Han Gao, Hangzhou (CN)

(73) Assignee: HANGZHOU HENUOVA TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 17/922,599

(22) PCT Filed: Apr. 25, 2021

(86) PCT No.: PCT/CN2021/089474
§ 371 (c)(1),
(2) Date: Oct. 31, 2022

(87) PCT Pub. No.: WO2021/227837
PCT Pub. Date: Nov. 18, 2021

(65) Prior Publication Data
US 2023/0168303 A1    Jun. 1, 2023

(30) Foreign Application Priority Data

May 15, 2020  (CN) .......................... 202010410028.8

(51) Int. Cl.
*G01R 31/34*     (2020.01)

(52) U.S. Cl.
CPC ................................. *G01R 31/343* (2013.01)

(58) Field of Classification Search
CPC ..................................................... G01R 31/343
See application file for complete search history.

(56) References Cited

U.S. PATENT DOCUMENTS

2005/0172637 A1*  8/2005  Ponziani ................. F02C 7/266
                                                              60/776

FOREIGN PATENT DOCUMENTS

CN         201133925 Y       10/2008
CN         103226182 A        7/2013
(Continued)

OTHER PUBLICATIONS

Li Long et al."Analysis and Treatment of a Generator Rotor Failure", Electric Engineering, No. 8, Apr. 30, 2020 (Apr. 30, 2020), ISSN: 1002-1388, pp. 61-62 and 65.

(Continued)

*Primary Examiner* — Alesa Allgood
(74) *Attorney, Agent, or Firm* — Bayramoglu Law Offices LLC

(57) ABSTRACT

A device and a method for nondestructively detecting a transient characteristic of a conductive screw of a turbo-generator rotor are provided. The device includes a personal computer (PC), an extremely-steep pulse generator, an ultra-high-frequency double-isolation transformer, and a pulse emitting and coupling module, which are connected in sequence. The pulse emitting and coupling module is connected to a load. A synchronous pulse receiving non-inductive divider circuit synchronously receives a characteristic waveform from the load, and the synchronous pulse receiving non-inductive divider circuit is connected to an ultra-high-speed analog/digital (A/D) module through a nonlinear saturation amplifying circuit that amplifies a signal. The PC receives a signal from the ultra-high-speed A/D module. The load includes a positive or negative excitation lead loop that is in a 180° symmetrical and instantaneous short-circuit state and a rotor shaft. The device detects state of the conductive screw in a blind area of electromagnetic wave test.

2 Claims, 4 Drawing Sheets

(56) References Cited

FOREIGN PATENT DOCUMENTS

| CN | 106152922 | A  | 11/2016 |
|----|-----------|----|---------|
| CN | 206975158 | U  | 2/2018  |
| CN | 108872856 | A  | 11/2018 |
| CN | 110346685 | A  | 10/2019 |
| CN | 111521939 | A  | 8/2020  |
| EP | 0608442   | A1 | 8/1994  |
| SU | 951571    | A1 | 8/1982  |

OTHER PUBLICATIONS

Xiao Yao et al."Location and Analysis of Rotor Short-Circuit Fault of 1000 MW Turbo-Generator", Hubei Electric Power, vol. 43, No. 3, Jun. 30, 2019 (Jun. 30, 2019), ISSN: 1006-3986, pp. 76-81.
Ao Guanyou, "Analysis of Large Generator Rotor Windings Using the RSO Test", Construction Materials & Decoration, May 31, 2017 (May 31, 2017), ISSN: 1673-0038, pp. 245-246.

\* cited by examiner

DEVICE AND METHOD FOR NONDESTRUCTIVELY DETECTING TRANSIENT CHARACTERISTIC OF CONDUCTIVE SCREW OF TURBO-GENERATOR ROTOR

CROSS REFERENCE TO THE RELATED APPLICATIONS

This application is the national phase entry of International Application No. PCT/CN2021/089474, filed on Apr. 25, 2021, which is based upon and claims priority to Chinese Patent Application No. 202010410028.8, filed on May 15, 2020, the entire contents of which are incorporated herein by reference.

TECHNICAL FIELD

The present disclosure provides a device and a method for nondestructively detecting a transient characteristic of a conductive screw of a turbo-generator rotor and belongs to the technical field of generator detection.

BACKGROUND

Large-scale turbo-generator is one of the main devices of a power plant and its good operation is vital to the development of power generation enterprises. The state of the key parts of the generator is directly related to the stable and safe operation of the generator. The rotor of the generator is excited by a direct current (DC), which is the basic condition for the stable and safe operation of the generator. Once the rotor circuit fails, it will have a great impact on the voltage and current of the generator, thereby threatening the normal operation of the unit. In the rotor circuit of the generator, the conductive screw of the rotor of the generator is a key part that plays double important roles. The conductive screw is not only the sole non-permanent connection point of the entire rotor excitation circuit, but also must be kept tight to prevent hydrogen leakage. When the rotor winding is running at high speed, the conductive screw is subjected to a strong current. Due to the rapid change of the excitation current affected by power grid fluctuations, the conductive screw has such hidden dangers as loosening and breaking. After the conductive screw fails, the contact resistance will increase, resulting in overheating, arc discharge, or even burnout, which will further cause severe electric power accidents.

Nuclear power units are different from ordinary thermal power units. As a base-load unit, the nuclear power unit generally has a longer operating cycle usually up to 12 or 18 months. It must be ensured that the generator set operates safely and well during the long operating period.

In recent years, generator failure and shutdown incidents have been more frequent due to the failure of the conductive screw of the rotor of the generator. Therefore, the detection of the conductive screw of the generator rotor has become an important topic in the industry. To ensure the safe state of the conductive screw is to ensure the safe operation of the generator.

The conductive screw is the sole point of maximum impedance mutation that conducts the excitation current from the inside to the outside of the rotor shaft. The large excitation current makes the conductive screw the place where the electromagnetic stress is most concentrated and the heavy influence is made, with complex bending and torsional vibrations. The large on-current will cause overheating, which will accelerate aging of the sealing gasket and cause hydrogen leakage. Conventional methods such as DC impedance detection and alternating current (AC) impedance detection recommended in the national standard cannot reflect the health of the conductive screw. In particular, the conductive screw cannot be seen at all, let alone detected, without pulling out the rotor and opening the end cap. As a result, the conductive screw of the rotor is prone to accidents. There have been reports of accidents caused by conductive screws flying off, while loosening of conductive screws is more common due to overheating. Therefore, it is necessary to detect the tightness of the conductive screw.

SUMMARY

In order to overcome the above-mentioned defects, an objective of the present disclosure is to provide a device and a method for nondestructively detecting a transient characteristic of a conductive screw of a turbo-generator rotor. The device and the method can detect the state of the conductive screw in a blind area of electromagnetic wave detection without pulling out the rotor, opening the end cap or removing the coupling.

The present disclosure provides a device for nondestructively detecting a transient characteristic of a conductive screw of a turbo-generator rotor. The device includes a personal computer (PC), an extremely-steep pulse generator, an ultra-high-frequency double-isolation transformer, and a pulse emitting and coupling module, which are connected in sequence, where the pulse emitting and coupling module is connected to a load. A synchronous pulse receiving non-inductive divider circuit synchronously receives a characteristic waveform from the load, and the synchronous pulse receiving non-inductive divider circuit is connected to an ultra-high-speed analog/digital (A/D) module through a nonlinear saturation amplifying circuit that amplifies a signal. The PC receives a signal from the ultra-high-speed A/D module. The load includes a positive or negative excitation lead loop that is in a 180° symmetrical and instantaneous short-circuit state and a rotor shaft.

Preferably, the extremely-steep pulse generator is a nanosecond high-voltage steep pulse generator, and the synchronous pulse receiving non-inductive divider circuit is a resistor divider circuit.

The present disclosure further provides a method for nondestructively detecting a transient characteristic of a conductive screw of a turbo-generator rotor, where from a positive or negative excitation lead to the conductive screw and to a main winding of a rotor, a transient rotating electric field pulse of a same parameter has different spatial damping correlations for media of different structures and materials; time-shared tests are performed separately, and characteristic waveforms of two positive or negative transient pulses are compared; inconsistencies in phase and amplitude occur when a dielectric constant of a part of a conductive screw is changed; and through the comparative analysis of the waveforms, a defect location and severity of the conductive screw are determined.

Specifically, the method includes the following steps:
(1) controlling, by the PC, the extremely-steep pulse generator to generate a pulse;
(2) applying a pulse by the ultra-high-frequency double-isolation transformer with a pass-band of 10 MHz or more as a secondary superposition source;
(3) coupling, by the pulse emitting and coupling module, a pulse after secondary superimposition to the load;

(4) receiving, by the synchronous pulse receiving non-inductive divider circuit, a feedback pulse from the load synchronously;

(5) amplifying, by the nonlinear saturation amplifying circuit, a voltage signal in step (4), and connecting the ultra-high-speed A/D module;

(6) receiving, by the PC, a signal from the ultra-high-speed A/D module to form a waveform; and (7) subjecting the waveform formed in step (6) to time-shared recording and synchronous comparison.

Specifically, the load includes a positive or negative excitation lead loop that is in an instantaneous short-circuit state and a rotor shaft, and an amplitude of a characteristic waveform of the load decays rapidly after multiple oscillatory waves.

Specifically, the nonlinear saturation amplifying circuit amplifies and converts a superimposed wave front of a transient wave with a slope in step (4) into an ultra-high-frequency extremely-narrow pulse oscillatory wave that is allowed to be displayed horizontally.

Specifically, a positive pole and the rotor shaft are first tested, then a negative pole and the rotor shaft are tested, and waveforms of the two tests are compared.

Beneficial Effects

The present disclosure can accurately detect the mechanical, electrical, and material health conditions of the conductive screw without pulling out the rotor, opening the end cap, and removing the coupling. The present disclosure can discover the defects existing in the conductive screw in advance, for example, the conductive screw is loose, the sealing gasket is aged and its contact performance is degraded, the front and back couplings are loose, etc.

DETAILED DESCRIPTION OF THE EMBODIMENTS

Embodiment 1

Figure 1:
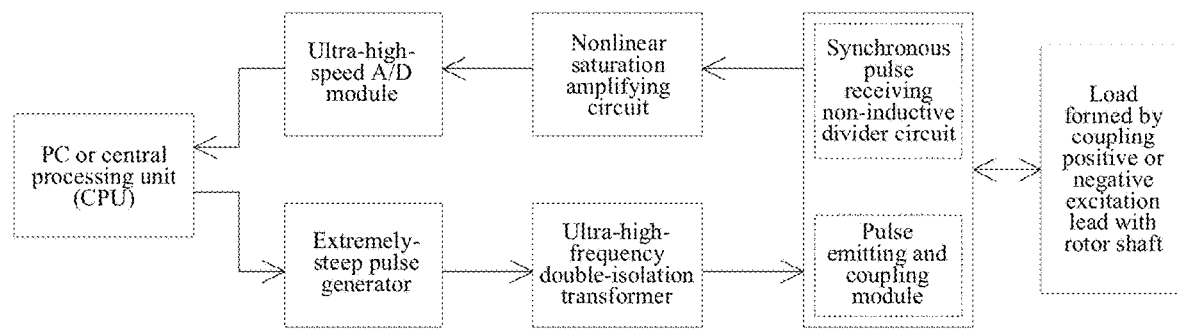
FIG. 1 is a connection diagram according to the present disclosure.
Figure 2:
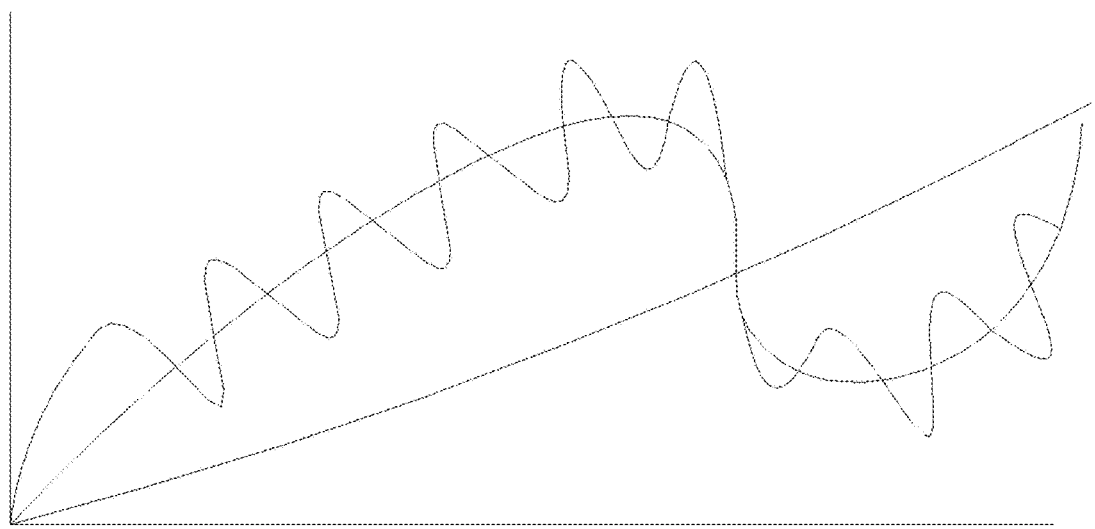
FIG. 2 is a coupled waveform diagram according to the present disclosure.

As shown in FIG. 1, the present disclosure provides a device for nondestructively detecting a transient characteristic of a conductive screw of a turbo-generator rotor, including a personal computer (PC), an extremely-steep pulse generator, an ultra-high-frequency double-isolation transformer, and a pulse emitting and coupling module, all of which are connected in sequence. The pulse emitting and coupling module is connected to a load. A synchronous pulse receiving non-inductive divider circuit synchronously receives a characteristic waveform from the load, and the synchronous pulse receiving non-inductive divider circuit is connected to an ultra-high-speed analog/digital (A/D) module through a nonlinear saturation amplifying circuit that amplifies a signal. The PC receives a signal from the ultra-high-speed A/D module.

The load includes a positive or negative excitation lead loop that is in an instantaneous short-circuit state and a rotor shaft.

Preferably, the extremely-steep pulse generator is a nano-second high-voltage steep pulse generator, and the synchronous pulse receiving non-inductive divider circuit is a resistor divider circuit.

The present disclosure further provides a method for nondestructively detecting a transient characteristic of a conductive screw of a turbo-generator rotor. From a positive or negative excitation lead to the conductive screw and to a main winding of a rotor, a transient rotating electric field pulse of a same parameter has different spatial damping correlations for media of different structures and materials. Time-shared tests are performed separately and characteristic waveforms of two positive or negative transient pulses are compared. Inconsistencies in phase and amplitude occur when a dielectric constant of a part of a conductive screw is changed. Through the comparative analysis of the waveforms, a defect location and severity of the conductive screw are determined.

The basis of electromagnetic transient test analysis is to describe the three-dimensional spatial fluctuation of a single pulse potential or electric field in time, corresponding to the result of the single electric field pulse in the conductor and the result of the energy fluctuation of the space field, so as to derive the three-dimensional fluctuation of the voltage. Low-frequency, macroscopic electromagnetic phenomena are the measurement results acquired after each single electromagnetic wave is accumulated, superimposed, and related disturbances before and after (especially ns-level) are integrated in time and space. Therefore, the most basic and accurate fluctuation information can be acquired by analyzing a single voltage pulse.

The transient rotating electric field pulse wave can be spirally conducted from the positive or negative excitation lead to the conductive screw. From the excitation lead to the conductive screw and to the main winding of the rotor, the transient rotating electric field pulse of the same parameter has different spatial damping correlations for media of different structures and materials, and has a gradient property around the insulating medium. When the transient rotating electric field pulse is diffracted and propagated, the dielectric constant of insulation changes, and the waveform acquired by the transient rotating electric field pulse changes accordingly. The transient pulse sensitivity is at the ns-level, and the slight change of the medium can be completely reflected by the transient pulse in the ultra-high-speed acquisition state. From the design and manufacturing point of view, the positive and negative conductive screws of the turbo-generator rotor should be completely symmetrical in terms of material, airtightness, torque, etc. The transient pulse wave of the same parameter is applied to the positive or negative pole and the reflected distributed dielectric constant should also be exactly the same. The characteristic waveforms of two transient pulses acquired in a time-shared manner are compared. If the dielectric constant of a certain part of the conductive screw changes, there will be inconsistencies in phase and amplitude. Through the waveform comparison analysis, the defect position and severity of the conductive screw can be determined. Through this method, the health state of the conductive rotor screw can be directly determined, thereby effectively evaluating and determining the severity of the fault. Through periodic detection of the conductive screw and acquisition and comparison of historical data, long-term data of the conductive screw can be cumulatively evaluated, and the health data of the conductive screw can be mastered. In this way, this method can realize the effective management of the health state of the device throughout its life cycle, give an early warning to the device state in advance, plan maintenance, and avoid unnecessary accidents.

Specifically, the method includes the following steps:
(1) controlling, by the PC, the extremely-steep pulse generator to generate a pulse;
(2) applying a pulse by the ultra-high-frequency double-isolation transformer with a pass-band of 10 MHz or more as a secondary superposition source;
(3) coupling, by the pulse emitting and coupling module, a pulse after secondary superimposition to the load;
(4) receiving, by the synchronous pulse receiving non-inductive divider circuit, a feedback pulse from the load synchronously;
(5) amplifying, by the nonlinear saturation amplifying circuit, a voltage signal in step (4), and connecting the ultra-high-speed A/D module;
(6) receiving, by the PC, a signal from the ultra-high-speed A/D module to form a waveform; and
(7) subjecting the waveform formed in step (6) to time-shared recording and synchronous comparison.

Specifically, the load includes a positive or negative excitation lead loop that is in an instantaneous short-circuit state and a rotor shaft, and an amplitude of a characteristic waveform of the load decays rapidly after multiple oscillatory waves.

Specifically, the nonlinear saturation amplifying circuit amplifies and converts a superimposed wave front of a transient wave with a slope in step (4) into an ultra-high-frequency extremely-narrow pulse oscillatory wave that is allowed to be displayed horizontally.

Embodiment 2

Figure 3:
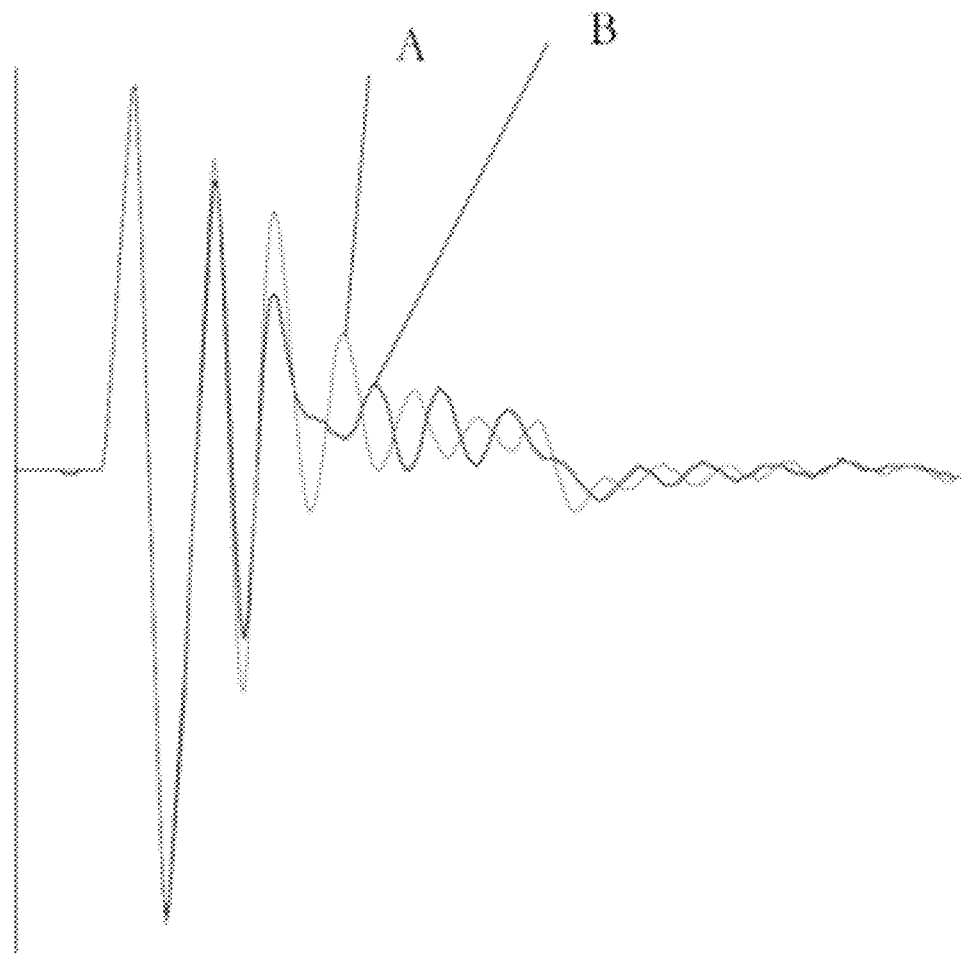
FIG. 3 is a waveform diagram of a faulty conductive screw according to Embodiment 2 of the present disclosure.

A 660 MW 30× unit of a nuclear power plant was overhauled, and the conductive screws were inspected at the J-type connecting piece by the method of the present disclosure. According to this method, under the same test voltage, test frequency and test conditions, the positive and negative waveforms of the fault-free conductive screw should be basically coincident on the time axis, and the positive and negative transient pulse waveforms should have no abnormality. However, as shown in FIG. 3, in this test, the positive transient characteristic (B waveform) of the rotor had an impedance imbalance phenomenon. The rotor was subjected to an airtightness test, and it was determined to be unacceptable. When the rotor left the factory, the pressure was 1.0 MPa. The leak point was found by the helium leak detection method, and it was found that there was a slight leak in the positive pole of the rotor.

Figure 4:
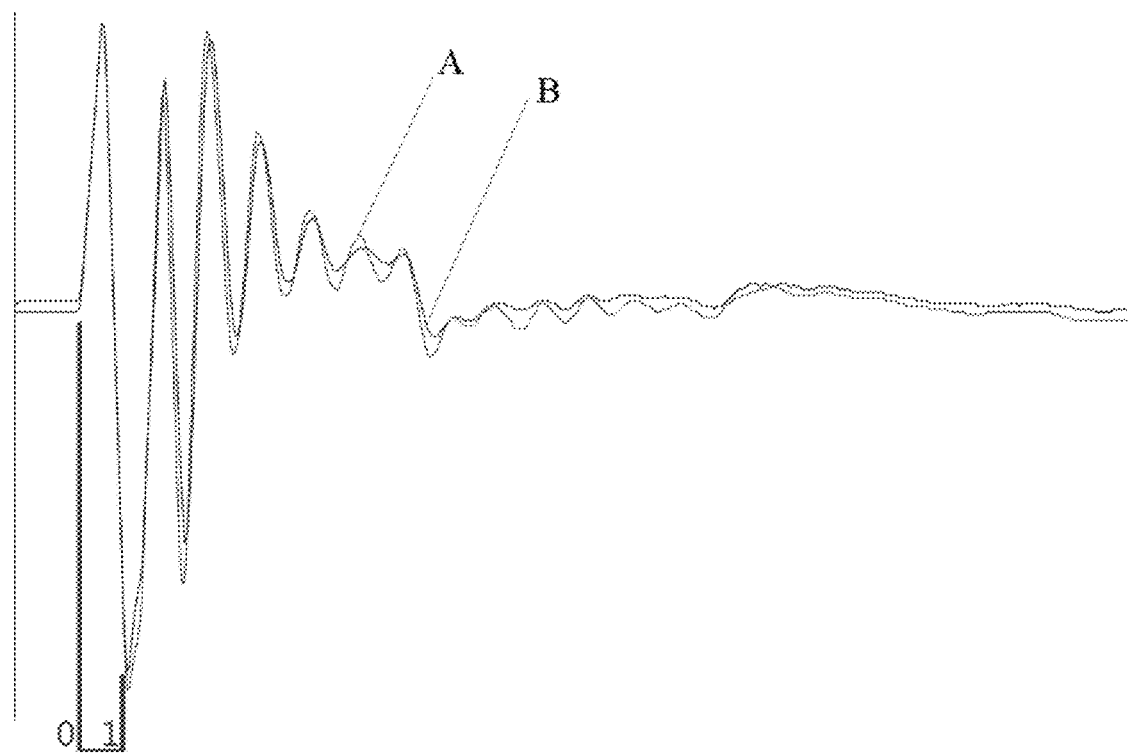
FIG. 4 is a schematic diagram of a normally tightened conductive screw according to Embodiment 2 of the present disclosure.

Factory personnel replaced the sealing gasket of the positive conductive screw. Then, it was found that the positive and negative transient characteristic waveforms were not very different and there was no obvious difference between the mutation points. The positive and negative waveforms basically overlapped, as shown in FIG. 4. Besides, the rotor passed the helium tightness test. Therefore, it was determined that the cause of the failure of the airtightness test was the aging of the sealing gasket.

Embodiment 3

Figure 5:
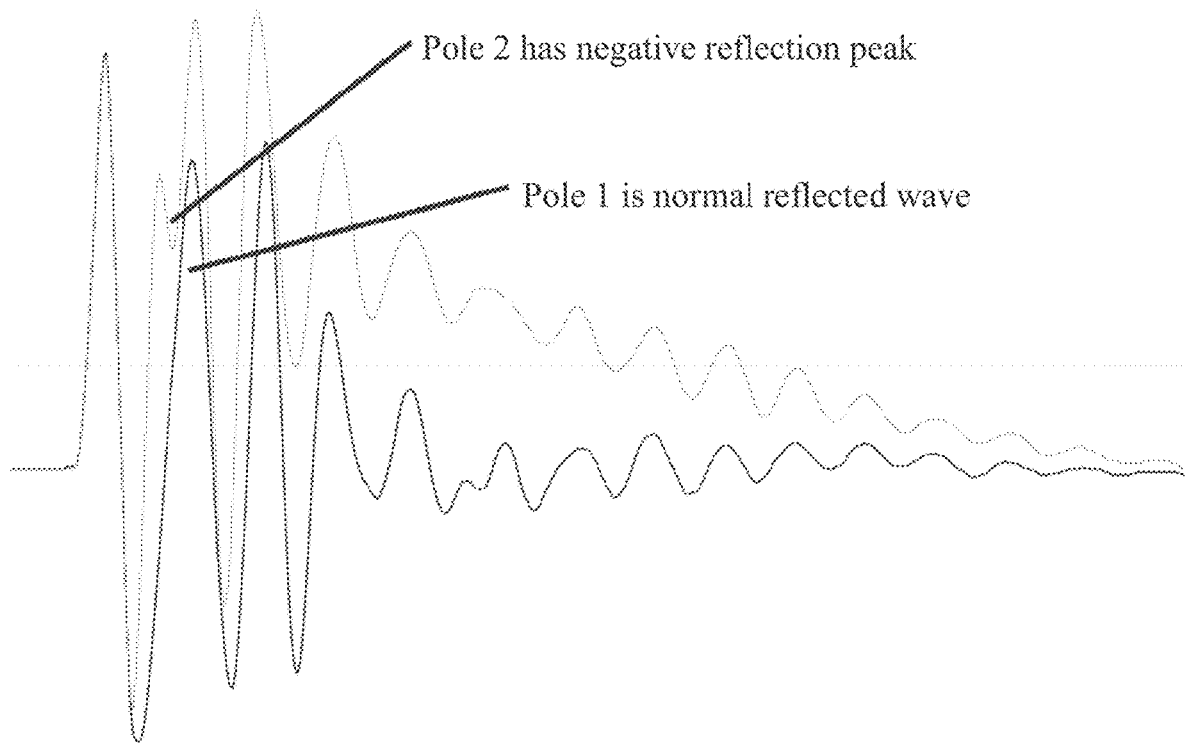
FIG. 5 is a waveform diagram of a faulty conductive screw according to Embodiment 3 of the present disclosure.
Figure 6:
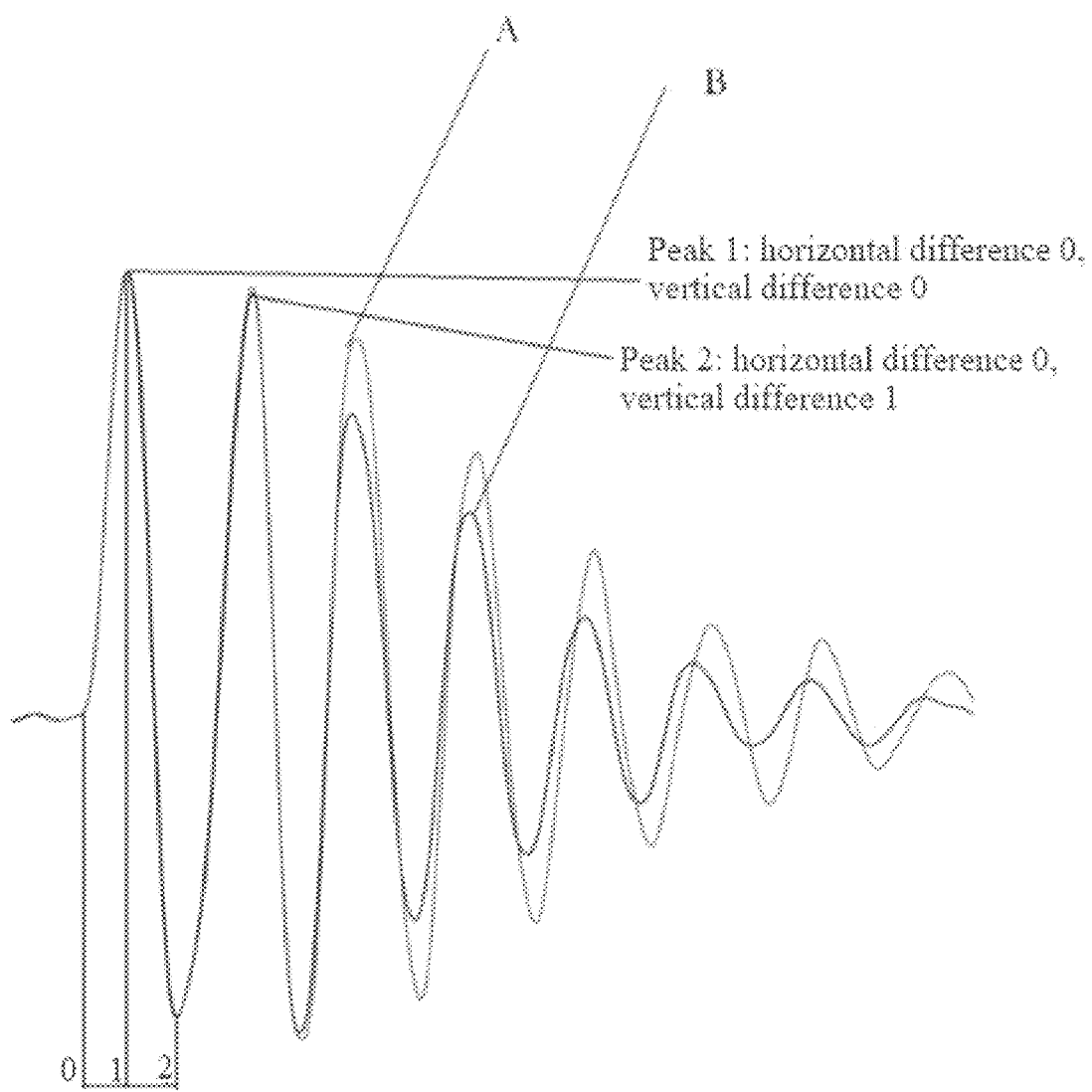
FIG. 6 is a schematic diagram of a normal conductive screw according to Embodiment 3 of the present disclosure.

The rotor winding of a 650 MW generator in a nuclear power plant was under maintenance, and the turbo-generator rotor was in the chamber. The airtightness test of the rotor winding was conducted, and the results of the DC impedance test were all normal. The test was conducted by the method of the present disclosure, and the test position was at the positive and negative collector rings. The positive waveform was denoted as waveform 1, and the negative waveform was denoted as waveform 2. The test voltage was 50 V, the instantaneous internal resistance was 100 uΩ, the instantaneous power of the component used was 100 W, and the divider resistance was 1:3 to 2:3, adjustable with the load. The characteristic waveforms of the transient pulses of the positive and negative poles to the rotor shaft were compared, as shown in FIG. 5.

The tightness of the conductive bolt was conducted at the J-shaped connecting piece. By comparing the test waveform of the positive pole to the rotor shaft, there was a negative reflection peak at the negative pole, resulting in a mismatched reflection.

Under the same test conditions, the negative waveform shifted on the time axis, and there was an obvious reverse reflection peak at the second waveform of the conductive screw.

Factory personnel fastened the conductive screws and couplings. Then, the rotor winding was tested by a conductive screw transient analyzer (CSTA). The rotor was in the chamber, the test position was at the positive and negative collector rings, and the test voltage was 50 V. The conductive bolts of the rotor winding were tested and the characteristic waveforms of the positive and negative transient pulses to the rotor shaft were compared. The horizontal difference at the falling edges of the positive and negative transient pulse waveforms was 0 for the first waveform. Peak 2 had a horizontal difference of 0 and a vertical difference of 1. The characteristic waveforms of the transient pulses of the positive and negative conductive screws of the rotor were basically symmetrical and there was no abnormality such as loosening.

What is claimed is:
1. A method for nondestructively detecting a transient characteristic of a conductive screw of a turbo-generator rotor, wherein the method is implemented base on a device for detecting the transient characteristic of the conductive screw of the turbo-generator rotor, wherein the device for detecting the transient characteristic of the conductive screw of the turbo-generator rotor comprises a personal computer (PC), an extremely-steep pulse generator, an ultra-high-frequency double-isolation transformer, and a pulse emitting and coupling module, which are connected in sequence: wherein the pulse emitting and coupling module is connected to a load; a synchronous pulse receiving non-inductive divider circuit synchronously receives a characteristic waveform from the load, and the synchronous pulse receiving non-inductive divider circuit is connected to an ultra-high-speed analog/digital (A/D) module through a nonlinear saturation amplifying circuit that amplifies a signal; the PC receives a signal from the ultra-high-speed A/D module:
the load comprises a positive and negative excitation lead loop that is in a 180° symmetrical and instantaneous short-circuit state and a rotor shaft: the extremely-steep pulse generator is a nanosecond high-voltage steep pulse generator, and the synchronous pulse receiving non-inductive divider circuit is a resistor divider circuit; from a positive or negative excitation lead to the conductive screw and to a main winding of a rotor, a transient rotating electric field pulse of a same parameter has different spatial damping correlations for media of different structures and materials; time-shared tests are performed separately, and characteristic waveforms of two positive or negative transient pulses are compared; inconsistencies in phase and amplitude occur when a dielectric constant of a part of a conductive screw is changed; and through the comparative analysis of the waveforms, a defect location and severity of the conductive screw are determined;

the specific detection method comprises the following steps:

(1) controlling, by the PC, the extremely-steep pulse generator to generate a pulse;

(2) applying a pulse by the ultra-high-frequency double-isolation transformer with a pass-band of 10 MHz or more as a secondary superposition source;

(3) coupling, by the pulse emitting and coupling module, a pulse after secondary superimposition to the load;

(4) receiving, by the synchronous pulse receiving non-inductive divider circuit, a feedback pulse from the load synchronously;

(5) amplifying, by the nonlinear saturation amplifying circuit, a voltage signal in step (4), and connecting the ultra-high-speed A/D module;

(6) receiving, by the PC, a signal from the ultra-high-speed A/D module to form a waveform; and (7) subjecting the waveform formed in step (6) to time-shared recording and synchronous comparison;

wherein an amplitude of a characteristic waveform of the load decays rapidly after multiple oscillatory waves; and the nonlinear saturation amplifying circuit amplifies and converts a superimposed wave front of a transient wave with a slope in step (4) into an ultra-high-frequency extremely-narrow pulse oscillatory wave that is allowed to be displayed horizontally.

2. The method for nondestructively detecting the transient characteristic of the conductive screw of the turbo-generator rotor according to claim 1, wherein a positive pole and the rotor shaft are first tested, then a negative pole and the rotor shaft are tested, and waveforms of the two tests are compared.

* * * * *